United States Patent [19]
Kahn et al.

[11] Patent Number: 5,502,345
[45] Date of Patent: Mar. 26, 1996

[54] UNITARY TRANSDUCER WITH VARIABLE RESISTIVITY

[75] Inventors: Manfred Kahn, Alexandria, Va.; Carl C. Wu, Potomac, Md.; Saadi Zain, New York, N.Y.

[73] Assignee: The United States of America as represented by the Secretary of the Navy, Washington, D.C.

[21] Appl. No.: 296,881

[22] Filed: Aug. 29, 1994

[51] Int. Cl.⁶ .................................................. H01L 41/08
[52] U.S. Cl. ........................... 310/358; 310/328; 310/330
[58] Field of Search ................................... 310/328, 330, 310/358

[56] References Cited

U.S. PATENT DOCUMENTS

| 4,524,294 | 6/1985 | Brody | 310/330 |
| 4,568,848 | 2/1986 | Ogawa | 310/358 |
| 4,862,029 | 8/1989 | Kasai et al. | 310/330 |

FOREIGN PATENT DOCUMENTS

| 0069278 | 3/1988 | Japan | 310/330 |
| 0219188 | 9/1988 | Japan | 310/358 |
| 0214678 | 9/1991 | Japan | 310/358 |

*Primary Examiner*—Thomas M. Dougherty
*Attorney, Agent, or Firm*—Thomas E. McDonnell; George A. Kap

[57] ABSTRACT

An actuator including a unitary ceramic element capable of bending in response to an applied voltage. The ceramic has a first region of lower resistivity in contact with a second region of higher resistivity. There is no seam where said regions contact each other. The first region contains an additive in an amount needed to reduce resistivity thereof relative to said second region. The second region is devoid of additive or contains a different additive that raises resistivity thereof or contains the same additive in a different amount than in the first region.

18 Claims, No Drawings

UNITARY TRANSDUCER WITH VARIABLE RESISTIVITY

FIELD OF INVENTION

This invention pertains to the field of monomorphic ceramic transducers that provide a bending moment.

DESCRIPTION OF INVENTION

The genus of transducers includes actuators and sensors. In conventional bimorphic actuators, linear strains are converted into bending motions when two flat pieces of piezoelectric material are bonded to one another and their polarizations or their applied voltages are such that one piece expands significantly more than the other. Such actuators suffer from relatively short life since the bond between the two pieces of piezoelectric material is continuously cycled in two directions and as a result, has a propensity to fail.

U.S. Pat. No. 4,862,029 to Kasai et al discloses a monomorph actuator composed of piezoelectric ceramic containing an amount of an additive which is uniformly distributed throughout the actuator. Kasai et al's actuator is a single layer of a thin ceramic material attached to a metal support at one end of the actuator and electroded on its major surface. It is capable of deflecting without preliminary poling. According to semiconductor theory, the reason for the deflection appears to be that the electric field near the ceramic surfaces is not uniform and is concentrated in the vicinity of the $N^+N$ metal-ceramic semiconductor to which reverse voltage is applied.

SUMMARY OF INVENTION

It is an object of this invention to provide a monomorphic ceramic actuator capable of bending in response to an applied electric field and having a long life.

It is another object of this invention to provide a unitary ceramic actuator having regions of different compositions and hence, different resistivities, devoid of a seam therein, which is capable of bending in response to an applied voltage, the bending taking place in response to the difference in the fields in the regions of different resistivities.

It is another object of this invention to provide a monomorphic ceramic actuator capable of bending in response to an applied electric field having a nonuniform cross-sectional composition.

These and other objects of this invention are attained by a ceramic actuator composed of at least two regions of ceramic material of different compositions and hence, of different resistivities, which actuator is devoid of a seam between the regions and is capable of deflecting in response to an applied voltage.

DETAILED DESCRIPTION OF INVENTION

This invention is based on the fusion of ceramic powders of different compositions in a manner that avoids a seam or a line of demarcation between the different regions. Powders of different compositions are prepared by admixing therewith or diffusing thereinto additives that affect the resistivity of the resulting sintered body. An actuator consisting of at least two ceramic regions of different resistivities will bend or deflect in response to an applied voltage because the regions have different resistivities and different piezoelectric coefficients.

The piezoelectric strain coefficient $d_{33}$ varies directly with poling field. The latter is lower in regions of lower resistivity that are disposed in series with regions of higher resistivity. Therefore, if a ceramic powder is admixed with an additive which causes it to be more electrically conductive, its resistivity will diminish.

The actuator of this invention is a monomorph which includes regions of ceramic materials which have different resistivities in which the regions of higher resistivity become preferentially poled. This actuator is devoid of a seam where the materials of different resistivities are joined. The actuator is of a unitary structure having nonuniform composition and thereby, resistivity, through a cross-section thereof. These actuators are capable of producing displacements of greater than 10 microns in response to an applied electric voltage in a time period as short as about 10 μs.

The materials from which an actuator of this invention can be made are ceramic powders having particle size of about 0.1 to 100 microns, typically about 1 micron. These powders can be obtained commercially. Any piezoelectric material may be used. Examples of useful piezoelectric caramics include electrostrictive lead magnesium niobate (PMN), piezoelectric lead zirconate titanate (PZT) and barium titanate ($BaTiO_3$). If an electric field causes a material to have a strain proportional to the square of the field, then such a material is usually electrostrictive. If a material develops permanent polarization and deforms more linearly with an applied field (at least with lower applied voltages), the material is piezoelectric. Electrostriction causes material deformation that is independent of the polarity of the applied field. An example of an electrostrictive material is PMN, i.e., $0.9\ Pb(Mg_{1/3}\ Nb_{2/3}\ O_3)$–$0.1\ PbTiO_3$. On the other hand, poled piezoelectric material has the ability to generate a voltage when mechanical force is applied or to produce a mechanical force or deformation when voltage is applied. An example of a piezoelectric material is PZT $[Pb(Zr_{0.52}Ti_{0.48})O_3]$ or barium titanate ($BaTiO_3$).

Electrostrictive materials offer certain advantages over piezoelectric materials in actuator applications in that they do not contain domains and so return to their original dimensions immediately when the field is reduced to zero, and they do not age. However, the piezoelectric materials are preferred in the actuators disclosed herein since they have a higher temperature stability.

A number of different piezoelectric ceramics are available to make an actuator of this invention. Such piezoelectric ceramics can contain dopants in amounts ranging from a very small amount, i.e., a fraction of a weight percent, to a level where the dopant is a significant component in the composition, i.e., 10% or more. The dopant can be lanthanum, tin, niobium, strontium or barium, and others which are added to the composition to affect a property. The ceramic PZT powder compositions which are commercially available already contain such dopants.

The ceramic compositions suitable herein have resistivities in the approximate range of 1–500 GΩ-m, more typically 10–300 GΩ-m, and a piezoelectric coefficient $d_{33}$ in the approximate range of 100–1000 pC/N, more typically 100–500 pC/N. The resistivities of these ceramic compositions can be reduced by at least two orders of magnitude by modifying the ceramic compositions with about 0.02–5% by weight, preferably about 0.5–3% by weight of an additive such metal oxides, for example, iron oxide, niobium pentoxide, zinc borate, lanthanum pentoxide and magnesium oxide. Zinc borate additive is preferred since it is easier to incorporate and gives less of a chance of cracking of the ceramic when the final actuator is made therewith. It is also possible to use other additives which increase the resistivity, giving added capability to provide the resistivity differential needed for the actuator to cause deflection.

The additive is used to modify the resistivity of a region in an actuator. The additive may be uniformly distributed throughout the region but it need not be so, since the principle objective of introducing the additive into a ceramic composition is to have a resistivity gradient after sintering. The resistivity of the ceramic material will be modified whether the additive is uniformly distributed or not. The manner of introducing the additive into the ceramic composition and the subsequent processing dictate whether the additive is distributed in the ceramic composition uniformly or non-uniformly.

The additive is typically admixed with the ceramic composition powder until a uniform distribution of the additive in the powder is attained. The additive is often also in powder form. The time over which the additive and the ceramic composition powders are mixed to obtain a generally uniform distribution of the additive is typically on the order of 1 hour, depending on the size of the batch, mixing equipment used, how the additive is added to the ceramic composition, and other factors.

However, the additive can be incorporated into the ceramic composition in any other manner. For instance, the additive can be dissolved in water that is then used to make a slurry containing the PZT composition powder. If the additive is incorporated in the ceramic composition by means of diffusion from a liquid or a gas, the ceramic composition is first formed into a structural preform and the additive is then diffused thereinto by bringing a surface of the structural preform in contact with the liquid or the gas containing the additive. The additive is then allowed to diffuse into the structural preform. Diffusion in this manner can take on the order of several hours depending on the porosity of the preform, the concentration of the additive in the liquid or gas, temperature, pressure and other parameters. Diffusion of the additive into the structural preform can be controlled to form a compositional gradient along a cross-section of the preform taken parallel to the direction of diffusion. The concentration of the additive in the structural preform will thus be greater at any point closer to the point of additive introduction than at any point further removed.

An actuator of this invention has at least two regions: one of a lower resistivity and one of a higher resistivity. Although there is no seam or line of demarcation physically delineating one region from the other, the two regions are different compositionally and as a result, have different resistivities. Upon application of an electric voltage, these different regions will expand differently and produce the desired bending. The thickness of each region is such as to produce the desired bending force. Where there is a continuous concentration gradient of the additive through a cross-section of the sintered ceramic, the exact thickness of the regions may be difficult to define exactly, because of the variable concentration of the additive through a cross-section of the ceramic. However, since up to about 0.25% by weight of the additive does not affect resistivity, the thickness of at least one region can be determined by measuring it to the level at which the concentration of the additive is about 0.25% by weight. If the additive is premixed with a first ceramic composition and then combined with a second ceramic composition devoid of the additive or containing a different additive or the same additive in a different amount, the amount of the additive in the second ceramic composition can be more nearly uniform. The thickness of a region having uniform composition can be controlled by adjusting the relative amount of the additive-containing or amount of additive-devoid ceramic composition that is used for forming the ceramic composition.

If the additive is to be introduced into the structural preform by diffusion, it may be introduced into the preform before, during or after sintering the preform. It is more practical to diffuse the additive into the green ceramic before sintering the preform.

One suitable procedure for making an actuator or an article of this invention, having one region of lower resistivity and one region of higher resistivity, starts with two batches of the ceramic composition. Two batches contain different amounts or different types of additives that are uniformly dispersed with each batch. One set of additives increases electrical conductivity so as to reduce the field during poling, and thus provide a lower piezoelectric coefficient $d_{33}$ after poling. A second set of additives increases the resistivity of the sintered ceramic.

A green ceramic preform is formed by introducing an amount of the first powder batch into a mold so that it is disposed in a generally uniform thickness and then introducing the second batch over the first batch and pressing or compacting the two batches. The compacting pressure should be sufficient to produce a unitary structural preform wherein the two batches are pressed together and do not show a seam or a line of demarcation between the two batches. The compacting pressure should be sufficient to impart a density to the green ceramic of greater than about 50% of theoretical. However, if the compacting pressure is too high, the structural preform can split or shatter upon ejection from the die and if the compacting pressure is too low, the preform will not be strong enough to be handled and the subsequent treatment will not result in maximum quality. The forming pressure is applied at room temperature and is typically in the range of about 1000–10,000 psi (6.8–68 MPa) and more typically in the range of about 4,000–6,000 psi (27.5–41 MPa).

Compaction of the powder particles in a mold merely forces the powder particles together so that particles are physically joined by the compaction force. The structural preform obtained after the compaction operation typically has a density of below about 70% and above about 50% of the theoretical density of about 7.95 g/cc, more typically about 50% to about 65%. At this point, the structural preform is powdery and can be broken up by manually squeezing or masticating it. When subjected to manual rubbing, particles are easily separated from the preform.

After being formed, the structural preform is removed from the mold and sintered in air at an elevated temperature. The principle objective of sintering is to fuse the powder particles together, to densify the ceramic and to develop the requisite crystal structure whereby the crystals grow in size and the resulting compact acquires the ability to deform, after poling, on application of electrical driving field. The preform may be sintered by slowly heating in air from about room temperature to an elevated temperature below 1400° C., holding the preform at the elevated temperature for a period of time of less than three hours and then slowly cooling it to about room temperature to prevent cracking. In a preferred embodiment, the sintering operation can be carried out in air in a tube kiln by raising temperature of the preform from about room temperature at a rate of about 2°–5° C./minute to an elevated temperature in the range of about 1050°–1350° C., holding the preform at the elevated temperature for a period of about 5 minutes to about one half hour and then slowly cooling it to about room temperature in a controlled manner at about 2°–8° C. per minute. Densification, composition control and development of the desired crystal structure do not take place unless the indicated parameters are adhered to. After the sintering procedure, the structural preform becomes a compact.

In order to preserve the lead in the preform during the sintering operation if a lead-containing composition is used, such as a PZT powder, the preform can be covered by a mixture of sintered PZT powder and at least one other material, such as zirconia ($ZrO_2$) beads, and a container with the preform be provided with a tight fitting cover before sintering in the usual manner. The zirconia beads prevent the PZT powder from fusing to the preform.

After sintering, the compact is a dense ceramic component which contains a developed crystal structure wherein the crystals are fused together, imparting to the compact a glazed appearance. The compact at this stage has theoretical density above that of the preform and above about 80% of the theoretical density of about 7.95 g/cc, typically above about 90%. Particles of the compact do not separate upon manual rubbing. Only after poling, however, does the compact exhibit an overall piezoelectric effect. Nevertheless, individual particles in the unpoled compact have a piezoelectric effect. The net or overall piezoelectric effect in the unpoled compact is about nil, since piezoelectric effect in the individual particles is directed in random directions and generally cancels out when considered overall.

If a region has a uniformly distributed added additive, the concentration of the additive in that region will be constant and there will be a sharp difference in the additive concentration in the adjoining region after compaction. Diffusion of the additive from one region to the adjoining region during sintering tends to flatten out the additive concentration profile. For optimum performance, the sintering profile is that which allows enough diffusion to reduce the abruptness of the transition between the additive containing and the to additive-free regions without excessively encroaching on the widths and on the uniqueness of the two regions. This reduced abruptness minimizes the high stresses that arise in the transition region during voltage-induced bending of the actuator.

Sintering the preforms to provide compacts with densities as low as about 80% of the theoretical density is included herein. Densities as low as 80% of the theoretical density make it easier to bend. This density reduction reduces the strength of the compacts but may result in enhanced or increased porosity.

The procedure for making an actuator or an article is somewhat different if the additive is to be introduced by diffusion. In such an instance, a structural preform is made from the ceramic composition to which the additive has not been admixed, as described herein. The ceramic composition is introduced into a mold and pressed to produce the preform. The preform at this stage is devoid of additive. The additive is introduced into the preform by diffusion from a gaseous, a liquid or a solid medium. After introduction of the additive into the preform by diffusion, sintering and poling operations follow, as described elsewhere.

The ceramic compact, sintered as described above, is provided with electrodes by providing on opposing surfaces thereof electrically conducting layers. Although any electrically conductive material can be used as electrodes on the ceramic compact, preferred are nickel-chromium alloy, gold or silver. The electrodes can be provided by dispersing the electrode material in powder form in a liquid medium to form a dispersion and then applying the dispersion onto opposing surfaces of the compact. After applying the dispersion to a compact, the compact can be placed in a drying oven and the electrode dispersion on the compact is dried. After drying, the thickness of each electrode is typically on the order of less than 100 microns.

The ceramic structural compact, complete with electrodes, is then poled to develop its overall piezoelectric effect. Poling is generally carried out in a high dielectric strength liquid or gaseous medium at an elevated temperature by subjecting the compact, complete with electrodes, to a high voltage, typically for a period of time of less than about one hour until sufficient alignment of the dipole moments is attained. This voltage is applied to the electrodes on the compact. Typically, poling of the ceramic compact can be effected by subjecting the ceramic compact, while disposed in the medium heated to 100°–150° C., to a field in the range of about 0.1–8 kV/mm of the compact thickness, more typically 1–3 kV/mm, typically for about 1 minute to about three quarters of an hour, more typically from about 5 minutes to about one-half hour. After poling, the dipole moments in the electroded compact are mostly aligned in the direction of the applied electric field and the compact is ready for use as an actuator.

The invention having been generally described, the following example is given as a particular embodiment of the invention to demonstrate the practice and advantages thereof. It is understood that the example is given by way of illustration and is not intended to limit in any manner the specification or any claims that follow.

EXAMPLE

This example demonstrates preparation of two actuators of this invention using PZT-5A ceramic powder with iron oxide powder additive in the first actuator and zinc borate powder additive in the second actuator. The zinc borate powder was obtained by treating zinc acetate with boric acid in water.

This PZT-5A ceramic powder, as received, had a near micron particle size and the PZT had the approximate stoichiometry of Pb($Zr_{0.52}$ $Ti_{0.48}$)$O_3$. The powder was processed by adding thereto 20% by weight water, 0.3% by weight surfactant, and the additive, if any, and mixed to form a slurry. The slurry was then ball milled with $ZrO_2$ beads as grinding media for about 18 hours. The ball milling operation served to further reduce the particle size of the powder, to break the powder agglomerates and to evenly distribute the additive, if present. The ball milled slurry was dried to a cake in a few minutes in an oven held at 120° C. The resulting cake was spex milled for about 5 minutes to break-up the cake and to form the powder used subsequently.

The actuator with the iron oxide additive was prepared by pouring into a die 0.75 g of the milled and unmodified PZT-5A powder. This PZT-5A powder formed a first region of the actuator. This powder was levelled out at bottom of the die and pressed lightly. Then, 0.75 g of the additive modified PZT-5A powder was added on top of the powder in the die and again levelled. The second powder batch formed the second region of the actuator. The modified powder contained evenly distributed 0.42% by weight (2.4 mole percent) iron oxide ($Fe_2O_3$) powder having a submicron particle size. Pressure of about 5500 psi (about 38 MPa) at room temperature was applied in the compaction press and a pressed structural preform was produced measuring about 12.7mm in diameter and about 2.6 mm thick.

The preform did not have a seam or a line separating the two powders and the density of the preform was 56% of the theoretical density.

The preform was then sintered in air in an alumina tube kiln measuring 76.2 mm in O.D., 1219 mm long and 6.375 mm thick. Both ends of the tube kiln were sealed during the sintering operation. To preserve the lead in the PZT preform, the preform was buried, before sintering, in the setter sand in an alumina boat covered with an alumina cover. The setter sand is a mixture of the PZT powder and of $ZrO_2$ beads about 0.75 mm in diameter. The setter sand had been previously heated to 1300° C. in a closed container. The sintering parameters included heating of the preform from room temperature at a rate of 3° C. per minute to 1150° C., holding it at 1150° C. for 20 minutes followed by gradual cooling to room temperature over a period of about 8 hours. The sintering operation changed the preform to a dense ceramic compact.

The compact after sintering had a density of about 90% of the theoretical density.

At this point, the ceramic compact in disk form was electroded at room temperature on both sides thereof, by applying, with a brush, Demetron 200 electrically conductive paint and drying the compact for about 5 minutes in a 100° C. oven to remove xylene and other volatile components from the silver paint. The thickness of the silver electrodes was about 100 microns.

Another electroded disk was prepared in the same way except with 2.0 mole percent (1.93% by weight) zinc borate additive in place of the iron oxide additive using a different batch of the PZT-5A powder. With zinc borate additive, the strain was about $45\times 10^{-4}$ at the applied field of 3500 volts.

Additional parameters pertaining to the two compacts are given in Table I, below:

TABLE I

|  | $\rho(G\Omega\text{-m})$* | $d_{33}$ (pC/N) | K |
|---|---|---|---|
| PZT powder w/o additive | 1.141 | 400 | 1500 |
| 0.43 wt % $Fe_2O_3$ additive | 0.009 | 200 | 600 |
| 50-50 composite | 0.263 | 135 | 748 |
| PZT powder w/o additive | 1.31 | 392 | 1310 |
| 2 wt % ZB additive | 0.003 | 57 | 1050 |
| 50-50 composite | 0.56 | 72 | 944 |

*$\rho$ was measured at 120° C.

The above Table I shows that the resistivity ($\rho$) of the sintered and poled compact made from the PZT-5A powder without adding any iron oxide additive thereto was above 1.14 G$\Omega$-m, measured at 120° C. A compact made from the same powder but containing the uniformly distributed iron oxide additive had a 120° C. resistivity of 0.009 G$\Omega$-m, and an averaged nonuniform resistivity of 0.263 G$\Omega$-m. The averaged nonuniform piezoelectric coefficient $d_{33}$ and the dielectric constant K were similarly affected by combining PZT powder which was devoid of the iron oxide additive with PZT powder which contained the evenly distributed iron oxide additive. There is no seam or line of demarcation between the region which was devoid of the additive and the region containing the additive.

Similar results were obtained for the compact containing the zinc borate additive.

Many modifications and variations of the present invention are possible in light of the above teachings. It is, therefore, to be understood that within the scope of the appended claims, the invention may be practiced otherwise than as specifically described.

What is claimed is:

1. An actuator comprising an actuator element containing regions of a ceramic material, at least one of said regions containing an additive of a different resistivity than a region devoid of said additive or the same additive in a different amount than in another region, wherein amount of said additive in one of said regions is about 0.02–5% based on total weight of said region and wherein said additive is selected from the group consisting of metal oxide compounds that are capable of reducing the resistivity of said ceramic material when mixed therewith, said element capable of deflecting in response to an applied electric field and having a continuous and an uninterrupted structure devoid of a seam between at least two of said regions.

2. The actuator of claim 1 wherein said additive is selected from the group consisting of iron oxide, niobium pentoxide, zinc borate, magnesium oxide, lanthanum pentoxide and mixtures thereof.

3. The actuator of claim 1 including electrodes on said actuator and wherein said additive is selected from the group consisting of iron oxide, zinc borate, and mixtures thereof and its density is greater than 80% of its theoretical density.

4. The actuator of claim 1 wherein the amount of said additive in at least one of said regions is in the range of about 0.5–3% based on total weight of said region.

5. The actuator of claim 2 wherein said ceramic material is selected from the group consisting of electrostrictive materials, piezoelectric materials, and materials that exhibit both electrostrictive and piezoelectric properties.

6. The actuator of claim 5 wherein said ceramic material is lead-zirconium-titanate (PZT) piezoelectric material having a resistivity in the range of about 1–500 G$\Omega$-m and said actuator is composed of sintered particles having dipole moments arranged in one direction.

7. The actuator of claim 6 wherein there is an overall dipole moment of said element primarily in one direction, the resistivity of said ceramic material is in the range of about 10–300 G$\Omega$-m, and its piezoelectric coefficient, $d_{33}$, is in the range of about 100–500 pC/N, and wherein said actuator is capable of producing deflections as great as about 100 microns.

8. An actuator element made of a ceramic material; said element comprising two continuous contacting first and second regions devoid of a seam therebetween: said first region having lower resistivity than said second region and said second region having higher resistivity than said first region; said first region containing an additive in amount of about 0.02–5% based on total weight of said region, said additive being selected from the group consisting of metal oxide compounds and mixtures thereof, said additive is responsible for the lower resistivity of said first region than said second region; said element being capable of bending in response to an applied voltage.

9. The actuator of claim 8 wherein amount of said additive is 0.5– 3% based on total weight of said first region and said additive is selected from the group consisting of iron oxide, zinc borate and mixtures thereof.

10. The actuator of claim 9 including electrodes on said element and wherein said ceramic material is lead-zirconium-titanate (PZT) piezoelectric material.

11. The actuator material of claim 8 wherein said ceramic material is lead-zirconium-titanate (PZT) piezoelectric material having resistivity in the range of about 1–500 G$\Omega$-m and said actuator is composed of sintered particles and having dipole moments arranged primarily in one direction.

12. The actuator of claim 10 wherein the resistivity of said ceramic material is in the range of about 10–300 GΩ-m and its piezoelectric coefficient, $d_{33}$, is in the range of about 100–500 pC/N, wherein said actuator is capable of producing deflection of at least about 10 microns.

13. The actuator of claim 8 wherein said ceramic material is lead-zirconium-titanate (PZT) piezoelectric material having resistivity in the range of about 1–500 GΩ-m and said actuator is composed of fused particles and having dipole moments arranged primarily in one direction.

14. The actuator of claim 13 wherein resistivity of said ceramic material is in the range of about 10–300 GΩ-m and its piezoelectric coefficient, $d_{33}$, is in the range of about 100–500 pC/N, and wherein said actuator is capable of producing deflection of at least about 10 microns.

15. The actuator of claim 8 wherein resistivity of said ceramic material is in the range of about 10–300 GΩ-m and its piezoelectric coefficient, $d_{33}$, is in the range of about 100–500 pC/N, deflection of said element taking place in response to the difference in resistivity in said regions.

16. An article comprising regions of a ceramic material having different piezoelectric strain coefficients, $d_{33}$, as a result of differences in ceramic composition wherein at least one of said regions has a different resistivity than an adjoining region, at least one of said regions containing an added additive which imparts a different resistivity to said additive containing region than resistivity of said adjoining region, the amount of said additive in one of said regions is about 0.02–5% by weight, said additive is selected from the group consisting of metal oxide compounds that are capable of reducing the resistivity of said ceramic material when mixed therewith, and said ceramic material is selected from the group consisting of electrostrictive materials, piezoelectric materials, and materials that exhibit both electrostriction and piezoelectric properties.

17. The article of claim 16 wherein said additive is selected from the group consisting of iron oxide, niobium pentoxide, zinc borate, magnesium oxide, lanthanum pentoxide and mixtures thereof; wherein amount of said additive in one of said regions is in the range of about 0.5–3% based on total weight of said region; and wherein said ceramic material is lead-zirconium-titanate (PZT) piezoelectric material having resistivity in the range of about 1–500 GΩ-m composed of sintered particles and having dipole moments arranged in one direction.

18. The article of claim 17 wherein said additive is selected from the group consisting of iron oxide, zinc borate, and mixtures thereof and density of said region containing said additive or containing same additive in a different amount is greater than 80% of its theoretical density.

* * * * *